United States Patent [19]

Blatter et al.

[11] Patent Number: 4,667,243

[45] Date of Patent: May 19, 1987

[54] TELEVISION RECEIVER FOR DIRECT BROADCAST SATELLITE SIGNALS

[75] Inventors: Harold Blatter; David J. Carlson, both of Indianapolis, Ind.

[73] Assignee: RCA Corporation, Princeton, N.J.

[21] Appl. No.: 793,197

[22] Filed: Oct. 31, 1985

[51] Int. Cl.[4] .......................... H04N 5/50; H04N 7/18; H04B 1/26

[52] U.S. Cl. .................................. 358/191.1; 455/141; 455/183; 455/338

[58] Field of Search ...................... 358/86, 188, 191.1, 358/193.1, 195.1; 455/133, 136, 141, 180, 182, 183, 188, 191, 277, 315, 338, 349

[56] References Cited

U.S. PATENT DOCUMENTS

| | | | |
|---|---|---|---|
| 2,691,724 | 10/1954 | Hoffman | 358/254 |
| 3,348,152 | 10/1967 | Laughlin | 455/141 |
| 3,810,038 | 5/1974 | Hershberg | 455/141 |
| 4,031,549 | 6/1977 | Rast et al. | 358/193 |
| 4,070,628 | 1/1978 | Funabashi | 325/316 |
| 4,131,851 | 12/1978 | Martiny et al. | 325/355 |
| 4,302,778 | 11/1981 | Tanaka | 358/195.1 |
| 4,357,632 | 11/1982 | French | 358/193.1 |
| 4,406,017 | 9/1983 | Takahashi | 455/141 |
| 4,509,210 | 4/1985 | Kohn | 455/349 |
| 4,518,993 | 5/1985 | Okada | 358/86 |
| 4,538,175 | 8/1985 | Balbes et al. | 358/86 |

Primary Examiner—Tommy P. Chin
Attorney, Agent, or Firm—Peter M. Emanuel; Adel A. Ahmed; Thomas F. Lenihan

[57] ABSTRACT

A television (TV) receiving system includes a first TV receiver for receiving TV signals in a first range of frequencies, such as are used for cable, VHF and UHF broadcasting including a frequency synthesizer type local oscillator. The frequency synthesizer uses a voltage controlled oscillator (VCO) controlled by a tuning voltage responsive to a first frequency feedback signal. The receiver includes a coupling arrangement for adapting the receiving system for use with an external plug-in unit including a second TV receiver for receiving TV signals in a second range of frequencies, such as are used for direct broadcast satellite (DBS) signals. The second TV receiver provides a second frequency feedback signal. The receiving system includes a multiplexer for selectively coupling one of the first and second frequency feedback signals to the frequency synthesizer for controlling the VCO.

13 Claims, 1 Drawing Figure

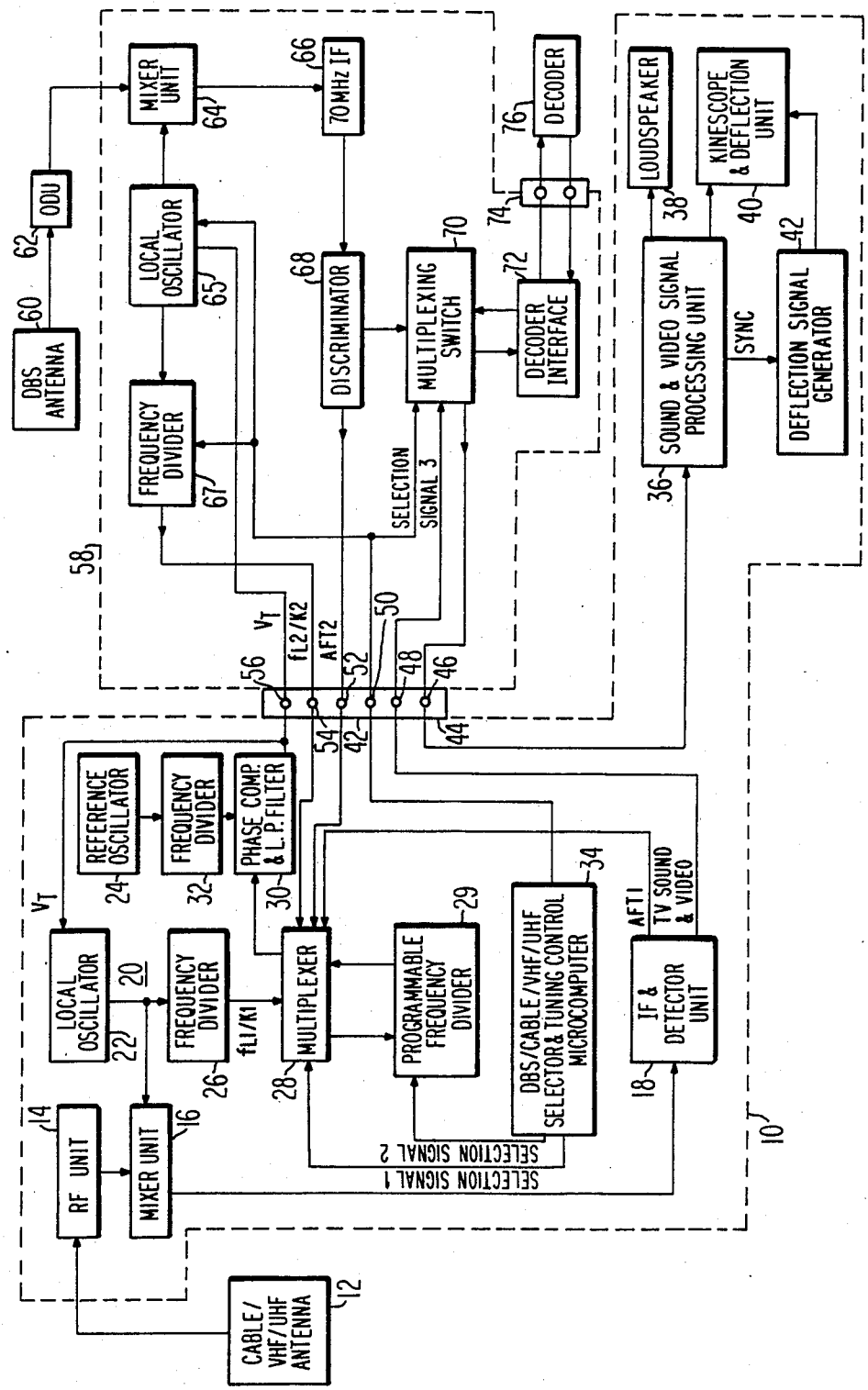

TELEVISION RECEIVER FOR DIRECT BROADCAST SATELLITE SIGNALS

FIELD OF THE INVENTION

The present invention relates to the field of television receivers and more particularly to television receivers for additionally receiving broadcast signals at frequencies higher than the very high frequency (VHF) and ultra high frequency (UHF) television broadcast bands, such as may be used for direct broadcasting from an earth satellite transmitter, commonly known as a direct broadcast satellite (DBS).

BACKGROUND OF THE INVENTION

In a typical DBS receiving system, the received signal, which is in the 12 GHz range, is first amplified by a low-noise amplifier and converted to the 1 GHz range. Both amplifier and converter are located outdoors, close to the antenna, so as to maintain the signal to noise ratio as high as possible. Typically, the converted 1 GHz signal is fed to a converter unit, generally placed on a television (TV) receiver cabinet and known as a "set top converter". This converter unit provides video and sound outputs which are then applied to corresponding inputs on the TV receiver or it may provide a modulated radio frequency (RF) output which can be received by the TV receiver on an unused channel frequency. In effect, the set top converter is a special purpose television receiver and generally includes a tuner and other necessary TV receiver circuitry, other than the picture display tube and its associated driver and deflection circuitry. A receiver for satellite transmissions is described in, for example, U.S. Pat. No. 4,538,175 in the name of Balbes et al.

SUMMARY OF THE INVENTION

It is herein recognized that it is desirable to avoid such duplication of much of the TV receiver circuitry in the set top converter. This will reduce the cost of the overall system for receiving DBS, "off the air", and cable signals. On the other hand, it is herein recognized that it is desirable to manufacture "DBS-ready" receivers which do not include all of the DBS conversion processing with its associated expense to both the manufacturer and the consumer (who may not want DBS capability at the time of purchase), but which may be readily and inexpensively adapted for DBS TV reception when this is desired.

In accordance with an aspect of the invention, a television signal receiving system includes a first superheterodyne receiver for receiving television signals in a first range of frequencies such as in conventional broadcast or cable bands. The receiver includes a a first voltage controlled local oscillator (VCLO) and a first arrangement for providing a first frequency feedback signal representative of the frequency of the first VCLO and a closed loop tuning control unit, such as a frequency synthesizer, for operating a tuning control signal for the first VCLO in response to the first frequency feedback signal.

The receiving system further includes a coupling arrangement for adapting the receiving system for use with a plug-in signal processing unit. The plug-in signal processing unit comprises a second superheterodyne receiver for receiving a television signal in a second range of frequencies such as in a DBS band. The second superheterodyne receiver comprises a second VCLO and a second arrangement for providing a second frequency feedback signal representative of the frequency of the second VCLO. The coupling arrangement comprises a first coupling element for coupling the second frequency feedback signal to the tuning control unit and a second coupling element for coupling the tuning voltage generated by the tuning control unit to the second VCLO.

In accordance with a further aspect of the invention, the receiving system further includes a mode selector providing a mode selection signal for selecting one of first and second operating modes, a first arrangement for providing a first automatic fine tuning (AFT) signal and, a sound and video signal processing unit. The plug-in signal processing unit includes a multiplexer having first, second and control inputs, the first input being coupled to an output of the second superheterodyne receiver. The second superheterodyne receiver further comprises a second arrangement for providing a second AFT signal. The coupling arrangement further comprises a third coupling element for coupling the second AFT signal to the tuning control unit, a fourth coupling element for coupling an output of the first superheterodyne receiver to the second input of the multiplexer, a fifth coupling element for coupling an output of the multiplexer to the sound and video signal processing unit, and a sixth coupling element for coupling the mode selection signal to the control input of the multiplexer.

BRIEF DESCRIPTION OF THE DRAWING

The sole FIGURE shows in block schematic form a television receiver arranged for DBS reception in accordance with the present invention.

DETAILED DESCRIPTION OF THE DRAWING

In the receiving system shown in the FIGURE, 10 is a TV receiver for receiving a TV signal from a source 12, such as a distribution cable service or a VHF or UHF antenna. An RF amplifier 14, a mixer unit 16, and intermediate frequency (IF) and detector unit 18 process the signal to provide an AFT signal AFT 1 and a TV sound and video output signal in a conventional manner.

The local oscillation signal for mixer unit 16 is provided by a frequency synthesizer 20 in which a local oscillator (VCLO) 22 is controlled in accordance with the frequency of a reference oscillator 24 in a phase lock loop arrangement. The frequency $f_{L1}$ of the local oscillator signal produced by VCLO 22 is first divided down by a factor K1 in a frequency divider 26 and applied by way of a multiplexer 28 to a programmable frequency divider 29 whose output is applied to a phase comparator and low pass filter unit 30. The frequency of reference oscillator 24 is divided down in a frequency divider 32 and applied with the AFT 1 signal as required as the other input to phase comparator and low pass filter 30. The filtered output of phase comparator and low pass filter 30 constitutes the correction signal which is applied as the tuning voltage $V_T$ to local oscillator 22. For tuning over different bands and channels, the division ratio of divider 29 is controlled by a selection signal 1 which is supplied by a selector and tuning control microcomputer 34. Multiplexer 28 is also controlled by a selection signal 2 provided by selector and tuning control microcomputer 34, as will be further explained later on. A frequency synthesizer of the same general type as that described above is disclosed in, for example, U.S. Pat. No. 4,357,632, in the name of Michael P. French and in U.S. Pat. No. 4,422,096 in the name of J. G. Henderson. A microcomputer controlled tuning system is described in U.S. Pat. No. 4,302,778 in the name of Akio Tanaka.

Receiver 10 further includes a sound and video signal processing unit 36 which provides an audio signal to a loud speaker 38 and video information signals to a kinescope unit 40. Sync components of the video signals processed by unit 36 are coupled to a deflection generator 42 which provides deflection signals to a deflection unit associated with the kinescope in unit 40.

Receiver 10 is also provided with a coupling device or connector plug 44 having a plurality of coupling elements or pins and to which a DBS reception plug-in unit to be described below may be connected. Pin 46 is coupled to the input of sound and video signal processing unit 36, while the TV sound and video output of IF and detector unit 18 is coupled to pin 48. Pin 50 is coupled to an output of microcomputer 34 providing a selection signal 3. Pins 52 and 54 are coupled to respective inputs of multiplexer 28. Pin 56 is coupled to the output of phase comparator and low pass filter 30 which provides the tuning voltage $V_T$. Plug 44 provides coupling between receiver 10 and a plug-in signal processing unit 58 which will be described next.

A signal received by DBS antenna 60 is first amplified and converted down in frequency by an outdoor unit (ODU) 62 before being applied to a mixer unit 64 in plug-in unit 58. The output of mixer unit 64 is processed by an IF unit 66 operating at 70 MHz and is then applied to a discriminator 68. The local oscillation signal for mixer unit 64 is provided by a voltage controlled local oscillator 65 whose output $fL2$ is supplied to a frequency divider 67 to produce an output of $fL2/K2$. The output of frequency divider 67 is coupled to pin 54 of connector plug 44. Discriminator 68 provides an AFT signal AFT 2 which is applied to pin 52 of plug 44 and a TV sound and video signal which is applied to an input of a multiplexing switch 70. Another input of multiplexing switch 70 is coupled to pin 48 of plug 44 for receiving the TV sound and video signal provided by IF and detector unit 18 of receiver 10. A control input of multiplexing switch 70 is coupled to pin 50 of plug 44 for receiving selection signal 3 from microcomputer 34. Selection signal 3 is also connected to control inputs of frequency divider 67 and voltage controlled local oscillator 65. Multiplexing switch 70 is also coupled to a decoder interface unit 72 which is coupled by way of a plug 74 to a decoder unit 76 which is external to plug-in unit 58.

In operation, if it is desired to have the capability of only receiving cable or VHF and UHF signals, such as "off the air" signals received by an antenna, plug-in unit 58 is not required. This mode of operation will be first described, assuming that plug-in 58 is not present. Plug 44 can be left open, except that pins 46 and 48 need to be coupled together, such as by way of a bridging dummy plug or, for example, by a contact finger which bridges pins 46 and 48 when plug-in unit 58 is not present. In this mode of operation, in response to the setting of a user input selector switch (not specifically shown) within unit 34 to a "NORMAL" position, the microcomputer generates selection signal 1. Selection signal 1 causes multiplexer 28 to couple the output of frequency divider 26 to programmable frequency divider 29 and the AFT 1 signal to phase comparator and low pass filter 30, thus enabling the operation of frequency synthesizer 20 to take place using local oscillator 22. Selection signal 2 selects the appropriate ratio in frequency divider 29 corresponding to the channel selected for providing the correct local oscillator frequency in local oscillator 22. The TV sound and video output of IF and detector unit 18 is applied by way of pins 48 and 46 to sound and video signal processing unit 36 for further processing in the usual manner.

In the case where plug-in unit 58 is inserted into plug 44, operation for cable, VHF, and UHF "off the air" signals is essentially similar to that already described except that for the "NORMAL" mode pins 46 and 48 are now coupled together by way of multiplexing switch 70 in plug-in unit 58 rather than by a dummy plug or contact finger. Multiplexing switch 70 is caused to couple pins 46 and 48 by a selection signal 3 provided by microcomputer 34 in response to the user's selection of the "NORMAL" mode. In this mode of operation, selection signal 3 also causes multiplexing switch 70 not to couple the output of discriminator 68 to pin 46, i.e. to the sound and video signal processing unit 36, which consequently receives only the TV sound and video signal provided by IF and detector unit 18. In this mode of operation, selection signal 1 causes multiplexer 28 to couple the $fL1/K1$ and AFT 1 signals generated internally within receiver 10 to local oscillator 22 but not to couple further either of the AFT 2 signal provided by discriminator 68 by way of pin 52 or the frequency feedback signal $fL2/K2$ provided by frequency divider 67. Operation of receiver 10 is thus essentially unaffected in this mode by the insertion of plug-in unit 58.

When a "DBS" mode of reception is selected, selection signal 1 causes multiplexer 28 not to couple further the frequency feedback signal $fL1/K1$ or the AFT 1 signal. Instead, multiplexer 28 is caused to couple the frequency feedback signal $fL2/K2$ by way of programmable divider 29 and the AFT 2 signal to phase comparator and low pass filter 30 for controlling the operation of frequency synthesizer 20, the tuning voltage $V_T$ now being applied to local oscillator 65. As before, the ratio of programmable frequency divider 29 is controlled by microcomputer 34 in accordance with the frequency of the channel selected so as to cause mixer unit 64 to provide a correct IF signal from the received DBS signal. It will be noted that the exact characteristics of frequency variation with control voltage for voltage controlled local oscillator 65 are not critical to its operation in the feedback-controlled closed loop operation described. This is an important and useful feature which makes it unnecessary to manufacture plug-in unit 58 to close tolerances matching the characteristics of receiver 10, which would have been required if local oscillator 65 were controlled in an open-loop manner without using the frequency feedback signal $fL2/K2$.

The IF signal provided by mixer unit 64 is processed by IF unit 66 and discriminator 68 to provide the AFT 2 signal and a TV sound and video signal to multiplexing switch 70. In this mode of operation, selection signal 3 causes multiplexing switch 70 not to couple further the TV sound and video signal on pin 48 but instead, to couple the TV sound and video signal provided by discriminator 68 to sound and video signal processing unit 36 by way of pin 46 for further processing in the usual manner.

It is thus apparent that receiver 10 contains substantially no extra parts other than those required for its normal operation for "off the air" or cable signal reception. Moreover, it has the capability of providing such reception in the normal manner even in the absence of plug-in unit 58. Furthermore, when plug-in unit 58 is present, the operation of receiver 10 remains substantially unaffected for the "off the air" or cable reception mode. In the DBS reception mode, a considerable portion of the elements in receiver 10 is utilized in conjunction with plug-in unit 58. Substantially, only the RF, mixer, and IF and detector portions of receiver 10 are not made use of in the DBS reception mode. On the other hand, frequency synthesizer 20, which forms a relatively complex portion of TV receiver 10, is utilized except for local oscillator 22 and frequency divider 26 for which local oscillator 65 and frequency divider 67 are substituted. A considerable amount of duplication of parts is thereby avoided.

In certain cases, it may be possible that DBS signals are encoded and that a decoder may be required for viewing such signals. The decoder illustratively shown as plug-in decoder unit 76 in the described embodiment, is coupled to the TV sound and video signal path when it is inserted into plug 74. The present invention has the advantage that decoder 76 is available for use in either mode of reception when plug-in 58 is being used. Such a feature is particularly useful in the event that decoding of cable signals is required.

The present invention has been described in terms of the specific embodiment of the FIGURE. It will be appreciated that various modifications may be made of specific portions of the embodiment. For example, frequency divider 32 may be programmable to provide greater flexibility in selecting tuning frequencies. Furthermore, while decoder 76 has been described as a plug-in, it may be incorporated as part of plug-in unit 58. It should be understood that these and similar modifications may be made without departing from the scope of the invention which is defined by the following claims.

What is claimed is:

1. A television signal receiving system including first superheterodyne receiver means for receiving a television signal in a first range of frequencies, said receiver means including frequency synthesizer means comprising first voltage controlled local oscillator (VCLO) means, means for providing a tuning voltage, and first means for providing a first frequency feedback signal representative of the frequency of said first VCLO means, and wherein said receiving system further includes:

coupling means for adapting said receiving system for use with a plug-in signal processing unit extermal to said receiving system, said plug-in signal processing unit including second superheterodyne receiver means for receiving a television signal in a second range of frequencies comprising second VCLO means, and second means for providing a second frequency feedback signal representative of the frequency of said second VCLO means, and said coupling means comprising a first coupling element for coupling said second frequency feedback signal to said frequency synthesizer means and further comprising a second coupling element for coupling said tuning voltage to said second VCLO means; and first multiplexing means for selectively coupling one of said first and second frequency feedback signals to said frequency synthesizer when said plug-in signal processing unit is plugged in, and for coupling said first frequency feedback signal to said frequency synthesizer when said plug-in signal processing unit is not plugged in.

2. The system receited in claim 1 wherein said first and second superheterodyne receiver means further include respective first and second means for providing respective first and second automatic fine tuning (AFT) signals, and wherein said first multiplexing means selectively couples one of said first and second AFT signals to said frequency synthesizer means when said plug-in signal processing unit is plugged in, and couples said first AFT signal to said frequency synthesizer means when said plug-in signal processing unit is not plugged in.

3. The system recited in claim 1 further including mode selection means providing a mode selection signal for selecting one of first and second operating modes, wherein said first superheterodyne receiver further includes first means for providing a first automatic fine tuning (AFT) signal, and sound and video signal processing means, wherein said plug-in signal processing unit further comprises a second multiplexer means having first, second and control inputs, said first input being coupled to an output of said second superheterodyne receive means for receiving a second television sound and video signal, wherein said second superheterodyne receiver further comprises second means for providing a second AFT signal, and wherein said coupling means further comprises a third coupling element for coupling said second AFT signal to said frequency synthesizer means, a fourth coupling element for coupling a first television sound and video signal from an output of said first superheterodyne receiver means to said second input of said second multiplexer means, a fifth coupling element for coupling a selected one of said first and second television sound and video signals from an output of said multiplexer means to said sound and video signal processing means, and a sixth coupling element for coupling said mode selection signal to said control input of said multiplexer means for conditioning said multiplexer to select one of said first and second television sound and video signals.

4. The system recited in claim 3 wherein said first multiplexer means has inputs coupled to said first means for providing a first frequency feedback signal, to said first coupling element, to said first AFT means, and to said third coupling element, and is responsive to said mode selection means selecting said first operating mode for causing said frequency synthesizer means to be responsive to said first frequency feedback signal and said first AFT signal and for coupling said first television sound and video signal from said output of said first superheterodyne receiver means to said sound and video signal processing means, and is responsive to said mode selection means selecting said second operating mode for causing said frequency synthesizer means to be responsive to said second frequency feedback signal and said second AFT signal and for coupling said second television sound and video signal from said output of said second superheterodyne receiver to said sound and video signal processing means.

5. The system receited in claim 4 wherein said second VCLO means and said second means for providing a second frequency feedback signal have respective control inputs for selectively inhibiting operation thereof and wherein said mode selection signal coupled by said sixth coupling element is further coupled to said respective control inputs.

6. The system recited in claim 5 wherein said plug-in unit includes further coupling means for receiving decoder means and decoder interface means for providing coupling between said second multiplexer means and said decoder means by way of said further coupling means.

7. The system recited in claim 6 wherein said mode selection means selecting said second operating mode causes said second television sound and video signal at said output of said second superheterodyne receiver to be coupled to said sound and video processing means by way of said decoder interface means.

8. The system recited in claim 1 wherein said first range of frequencies is lower than second range of frequencies.

9. The system recited in claim 8 wherein said first range of frequencies includes the very high frequency and ultra high frequency bands for television broadcasting.

10. The system recited in claim 9 wherein said second range of frequencies includes a frequency employed for direct broadcasting to a DBS antenna.

11. The system recited in claim 7 wherein said first range of frequencies is lower than said second range of frequencies.

12. The system recited in claim 11 wherein said first range of frequencies includes the very high frequency and ultra high frequency bands for television broadcasting.

13. The system recited in claim 12 wherein said second range of frequencies includes a frequency employed for direct broadcasting to a DBS antenna.

* * * * *